（12) United States Patent
Kikuchi

(10) Patent No.: US 6,600,293 B2
(45) Date of Patent: Jul. 29, 2003

(54) BATTERY CONTROL SYSTEM

(75) Inventor: Yoshiaki Kikuchi, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 10/202,836

(22) Filed: Jul. 26, 2002

(65) Prior Publication Data

US 2003/0025479 A1 Feb. 6, 2003

(30) Foreign Application Priority Data

Aug. 3, 2001 (JP) ........................................ 2001-235841

(51) Int. Cl.$^7$ ............................................. H01M 10/44
(52) U.S. Cl. ....................................................... 320/131
(58) Field of Search ............................... 320/125, 127, 320/128, 131, 134, 135, 136, 160, 150

(56) References Cited

U.S. PATENT DOCUMENTS 6,204,636 B1 * 3/2001 Kinoshita et al.
6,465,988 B2 * 10/2002 Ito et al.

FOREIGN PATENT DOCUMENTS

JP    A 2001-69608    3/2001

OTHER PUBLICATIONS

U.S. patent application Ser. No. 10/174,204, Kimura et al., filed Jun. 17, 2002.

* cited by examiner

*Primary Examiner*—Edward H. Tso
(74) *Attorney, Agent, or Firm*—Oliff & Berridge, PLC

(57) ABSTRACT

A battery control system capable of relatively smoothly canceling memory effects caused to a battery mounted on a hybrid vehicle, while avoiding deterioration of the battery and vehicle performance. Upon detection of generation of charge memory effects, an HVECU changes the center of a control range for the battery's charged amount (SOC) from its ordinary value to a value in the vicinity of an upper limit of an appropriately charged range. This SOC control is continued for a predetermined amount of time for cancellation of charge memory effects. Under such control, SOC basically varies within a range lower than where excessive charging may possibly be caused, so that battery deterioration due to excessive charging and droped power consumption due to prohibited charging can be prevented. Meanwhile, upon detection of discharge memory effects, the center of the control range is set at a value in the vicinity of a lower limit of an appropriately charged range, so that deterioration of vehicle's dynamic performance is prevented.

5 Claims, 4 Drawing Sheets

BATTERY CONTROL SYSTEM

BACKGROUND OF THE INVENTION (a) Field of the Invention

The present invention relates to a battery control system for controlling a charged amount of a secondary battery mounted on a hybrid vehicle, and in particular to cancellation of memory effects generated in a secondary battery which uses a nickel compound.

(b) Description of the Related Art

Conventionally, hybrid vehicles which are equipped with an engine-driven generator in addition to a vehicle driving motor have been known. Such a hybrid vehicle is additionally equipped with a battery (a main battery) so that the vehicle driving motor is driven using power from the battery, which is in turn charged using power from the generator. The vehicle driving motor and the engine are used to rotate the wheels for traveling.

A charge level of a battery is observed for control utilizing an index known as the State of Charge, or SOC. The SOC is defined by a ratio of an amount of residual charge relative to a full charge capacity. Presently, SOC is generally measured using combination of a measurement method utilizing correlation between SOC and a battery's voltage-current characteristics (I–V characteristics) at the time of charging (or discharging), and a measurement method utilizing accumulation of charged and discharged amounts.

A battery control system controls charging and discharging of a battery based on SOC. Specifically, for charging and discharging control, SOC values are divided into three ranges, namely, a charging prohibited range, a discharging prohibited range, and an appropriately charged range. In a charging prohibited range, corresponding to SOC being 80 to 100%, for example, further charging is prohibited because excessive charging could possibly result. In a discharging prohibited range, corresponding to SOC being 0 to 20%, for example, further discharging is prohibited to prevent excessive discharging. In an appropriately charged range, corresponding to SOC being 20 to 80%, for example, excessive charging or discharging are both unlikely, and further charging and discharging are both allowed.

Power consumption efficiency deteriorates in a charging prohibited range because, due to charging being prohibited, redundant energy is not regenerated into power, but is instead discharged as heat or the like. In a discharging prohibited range, on the other hand, a motor is not driven because discharging is prohibited, and engine power is used for charging a battery, which adversely affects a vehicle's dynamic performance.

In consideration of the above, a battery control system controls such that SOC is maintained within an appropriately charged range. Specifically, driving of a motor and a generator is controlled during ordinary traveling such that an SOC varies within a predetermined control range which is set with a predetermined target charged amount level, for example, about 50%, at the center.

Here, hybrid vehicles often employ NiMH batteries. With batteries using a nickel compound, repetitive charging and discharging within a predetermined control range set around the above mentioned target charged amount level causes memory effects.

Memory effects are caused in electric products by repetitive charging of a battery before full discharging. Once memory effects have been created, an electromotive force of the battery drops after a smaller amount of discharging, even when discharging begins with the battery in fully charged status. That is, the effective operating time of the battery is reduced. Such memory effects are referred to as discharge memory effects for discrimination from the charge memory effects described below. Discharge memory effects can be cancelled by excessive charging of the battery.

Charge memory effects are caused through repetitive discharging of a battery before full charging. Once charge memory effects are caused, the battery's charge receivability is deteriorated. That is, an electromotive force of the battery reaches a level equivalent to that in a fully charged status when it receives a smaller amount of charge. In still other words, the battery's maximum charge capacity is reduced.

Whereas charging of ordinary electric devices is basically continued until the device is fully charged, charging of a hybrid vehicle is controlled such that charging and discharging are repeated within a predetermined control range which is set within an appropriately charged range, as described above. Therefore, with a hybrid vehicle, discharge memory effects similar to those in other electrical devices, are caused, and moreover charge memory effects, which are unlikely to be caused in ordinary electrical products, are also likely to be caused.

As described above, a hybrid vehicle uses energy from a battery to enhance dynamic performance, converts kinetic energy into electric energy using a regeneration brake, and stores the converted energy in a battery to improve power consumption. Therefore, when charge memory effects are generated and maximum charge capacity is thus reduced in a hybrid vehicle, vehicle performance is deteriorated because both the amount of energy that can be output and the amount that can be retrieved are reduced.

Such charge memory effects can be countered or cancelled through excessive charging. Japanese Patent Laid-open Publication No. 2001-69608, for example, proposes a technique in which a control range for SOC variation is set larger so as to be closer to a fully discharged or charged level so that memory effects are cancelled.

Although charge memory effects can be cancelled through excessive charging, as described above, excessive discharging generates hydrogen molecules ($H_2$) and oxygen molecules ($O_2$) through electrolysis of water in the battery, which causes internal pressure to increase. Moreover, recombination reaction between $H_2$ and $O_2$ causes temperature to increase. Such increases of internal pressure and temperature accelerate battery deterioration. At present, however, because variation of electric load of a hybrid vehicle during traveling is large, it is difficult to apply stable charging at a low rate so as to prevent increases of temperature and internal pressure for cancellation of charge memory effects.

In addition, because excessive charging for cancellation of discharge memory effects results in significant deterioration of dynamic performance, it is preferable that excessive charging not be applied during traveling.

Further, with the above-noted technique for setting a larger control range for SOC variation so as to be closer to a fully charged or discharged level, a varying SOC remains within an appropriately charged range, which is a middle range where the battery is neither fully charged or discharged, for a longer time. As a result, a longer time is required to cancel memory effects.

SUMMARY OF THE INVENTION

The present invention has been conceived in order to address the above problems and aims to provide a battery control system which can relatively smoothly cancel memory effects created in a battery used on a hybrid vehicle, while avoiding deterioration of either vehicle performance or the battery.

According to one aspect of the present invention, there is provided a battery control system comprising memory effects determining means for determining generation of memory effects in the secondary battery and target level setting means for setting the target charged amount level at a predetermined normal level when generation of memory effects is not determined and at a closer-to-limit level closer than the normal level to an upper limit or a lower limit of the appropriately charged range when generation of memory effects is determined.

Specifically, upon determination of generation of memory effects, at least one of these operations is applied, namely, increasing of a target charged amount level from a normal level to the vicinity of the upper limit of an appropriately charged range and reduction of a target charged amount level from a normal level to the vicinity of the lower limit of an appropriately charged range. Increasing of the target charged amount level to a level in the vicinity of the upper limit level can cancel charge memory effects, while reduction of the target charged amount level to a level in the vicinity of the lower limit level can cancel discharge memory effects.

In one embodiment of the present invention, the charged amount may be controlled so as to vary within a predetermined control range which has the target charged amount level at the center and is set within the appropriately charged range, and a control range for the closer-to-limit level may be identical in size to or smaller than a control range for the normal level.

Specifically, a predetermined control range centered at a target charged amount level is set as a target control range of a stored charged amount within the appropriately charged range, and a stored charged amount is controlled so as to vary within this range during most traveling. Because the control range for the closer-to-limit level is either identical in size to or narrower than the control range for the normal level, a control range for a closer-to-limit level is smaller than the appropriately charged range and set closer to either the upper or lower limit of the appropriately charged range. This arrangement increases the likelihood that the charged amount will vary within a range closer to the upper or lower limit, which enables smoother cancellation of charging or discharge memory effects compared to a case wherein, for example, the control range is set as the entire appropriately charged range.

In one embodiment of the present invention, the target level setting means may preferably maintain the target charged amount level at the closer-to-limit level for a predetermined amount of time when generation of memory effects is determined.

Specifically, upon determination of generation of memory effects, the target charged amount level is set at a closer-to-limit level and maintained there for a predetermined time and, after the elapse of the predetermined time, the target charged amount level is returned to a normal level. The predetermined time during which the target charged amount level is maintained at the closer-to-limit level is determined based on the period of time required to cancel memory effects. The period of time required for cancellation of memory effects with the target charged amount level maintained at a closer-to-limit level can vary depending on, for example, a difference between the closer-to-limit level and the upper or lower limit of the appropriately charged range, or the size of a charged amount control range set with the closer-to-limit level at the center.

In another embodiment of the present invention, preferably, the closer-to-limit level may be set in the vicinity of the upper limit of the appropriately charged range.

A secondary battery mounted on a hybrid vehicle is generally a combination battery constituting of a plurality of serially connected batteries (unit cells), in which a charged amount may vary for each unit cell. In this embodiment, by increasing the target charged amount level to be closer to the upper limit of the appropriately charged range, variation in charged amounts among unit cells constituting the secondary battery can be reduced so that charged amounts of the respective unit cells constituting the secondary battery can be made uniform.

According to another aspect of the present invention, there is provided a battery control system for controlling a charged amount of a secondary battery mounted on a hybrid vehicle such that the charged amount is maintained in the vicinity of a predetermined target charged amount level which is set within an appropriately charged range in which excessive charging and discharging are prevented, comprising memory effects determining means for determining generation of charge memory effects and discharge memory effects of the secondary battery; target level setting means for setting the target charged amount level at a predetermined normal level when generation of charge memory effects or discharge memory effects is not determined, in the vicinity of an upper limit of the appropriately charged range when generation of charge memory effects is determined, and in the vicinity of a lower limit of the appropriately charged range when generation of discharge memory effects is determined.

DESCRIPTION OF THE PREFERRED EMBODIMENT

In the following, an embodiment of the present invention in the form of a battery control system for a hybrid vehicle will be described with reference to the drawings.

Figure 1:
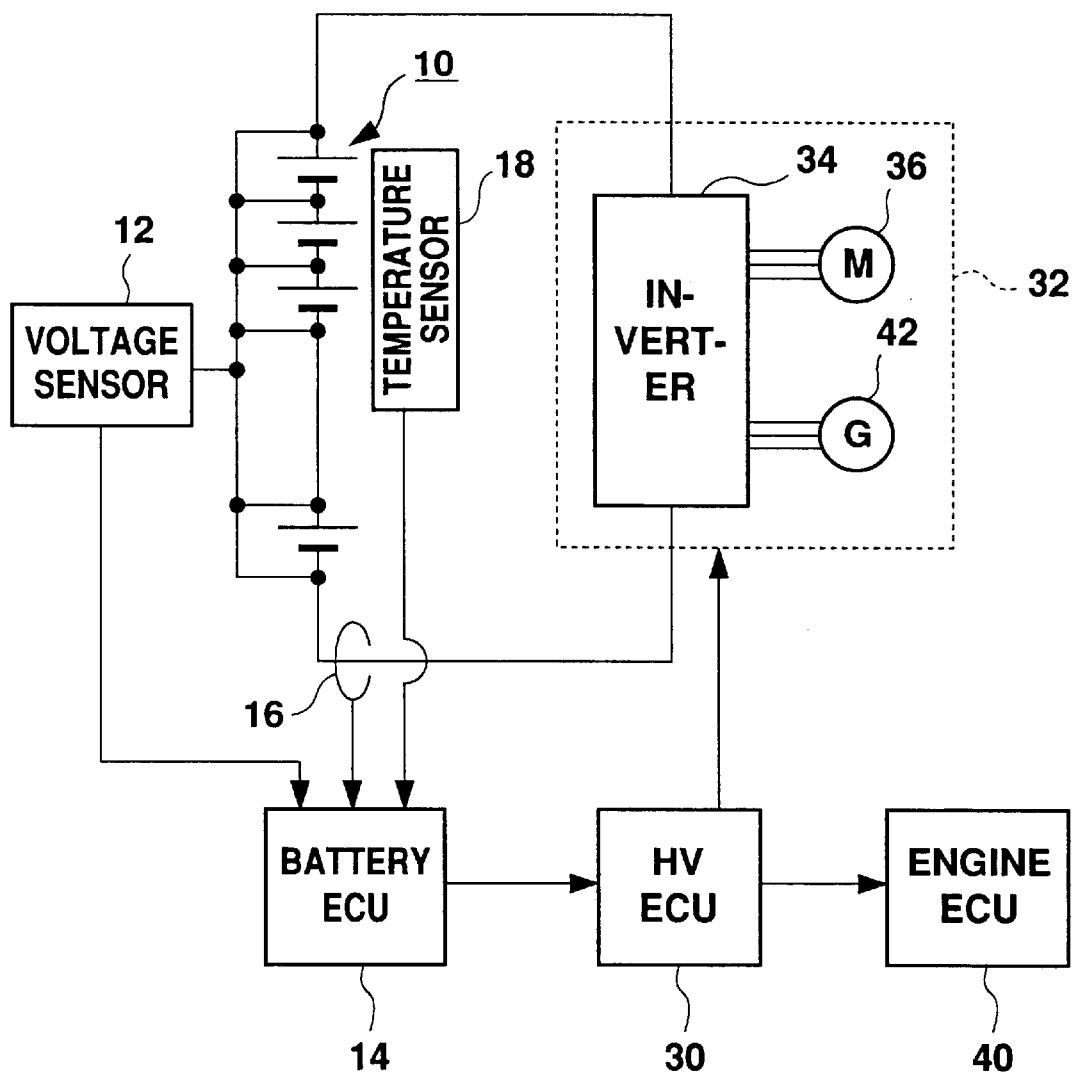
FIG. 1 is a block diagram schematically showing the overall structure of a battery control system according to an embodiment of the present invention.

FIG. 1 is a block diagram schematically showing the overall structure of a battery control system according to an embodiment of the present invention, in which a main battery of a hybrid vehicle, or a battery 10, is a Nickel metal hydrogen (NiMH) battery. The battery 10 is a combination battery constituting of a plurality of serially connected battery cells, from which a high voltage, for example 280 V, is obtainable.

The battery 10 constitutes of battery blocks each consisting of a small number of serially connected battery cells, and a voltage of each battery block is measured by a voltage sensor 12. In the drawing, one battery block is represented by one battery symbol. A result of measurement by the voltage sensor 12 is supplied to a battery ECU 14.

A current sensor 16 measures charged and discharged current with respect to the battery 10, and a result of the measurement is supplied to the battery ECU 14. The battery 10 has a temperature sensor 18 for measuring its temperature, and a result of the measurement also is supplied to the battery ECU 14.

The battery ECU 14 accumulates charged or discharged current with respect to the battery 10 for estimation of SOC of the battery 10. Also, the battery ECU 14 determines generation of charge memory effects in the battery 10 based on information concerning voltage, current, and temperature during discharging or charging with respect to the battery 10, the information being obtained from the voltage sensor 12, the current sensor 16, and the temperature sensor 18.

Figure 2:
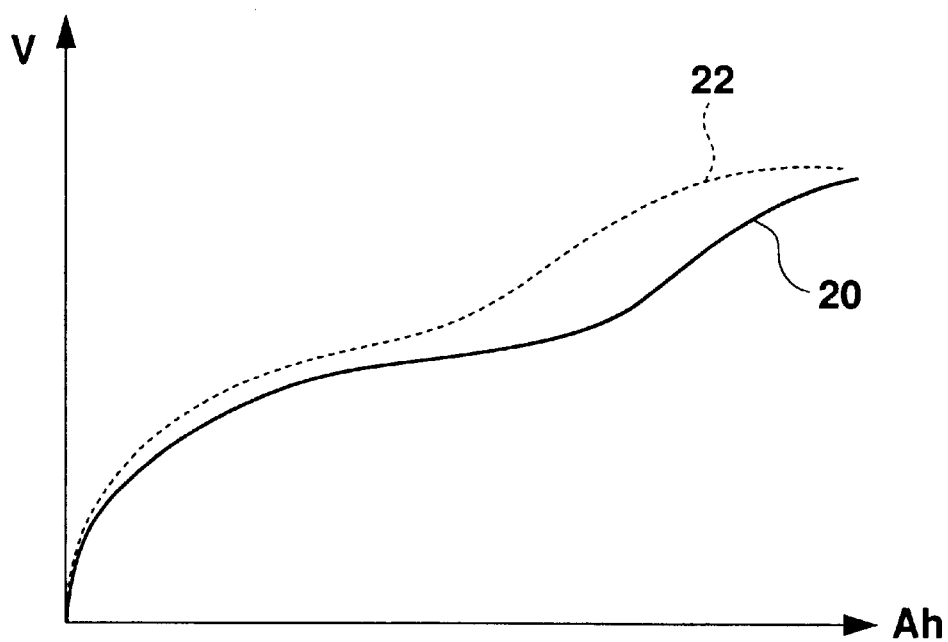
FIG. 2 is a schematic graph concerning voltage characteristics at the time of charging.

FIG. 2 is a graph schematically showing voltage characteristics at the time of charging, for explaining charge memory effects of a battery 10. The abscissas of the graph indicates a charged amount of a battery 10, while the ordinates indicates an electromotive force thereof. The solid line shows initial voltage characteristics 20, that is, before generation of charge memory effects or after cancellation thereof, while the dotted line represents voltage characteristics 22 with charge memory effects present.

Once charge memory effects are generated, an electromotive force increases at an early stage as a charged amount increases, so that maximum charge capacity is accordingly reduced. The battery ECU 14 stores, for example, information concerning initial voltage characteristics 20. It should be noted that, because voltage characteristics can vary depending on temperature, the battery ECU 14 stores a plurality of initial voltage characteristics 20 relative to different temperatures.

The battery ECU 14 then determines present voltage characteristics based on an electromotive force of the battery 10, which is measured by the voltage sensor 12, and a charged amount, which is calculated based on a result of measurement by the current sensor 16. The battery ECU 14 compares the determined present voltage characteristics and the initial voltage characteristics 20 corresponding to the temperature determined by the temperature sensor 18, and, when it determines that the maximum charge capacity has been reduced, determines generation of charge memory effects. It should be noted that the battery 10 may have other sensors, such as a pressure sensor, so that the battery ECU 14 determines reduction of maximum charge capacity due to charge memory effects, based on other information such as pressure information and so forth.

The battery ECU 14 outputs the obtained SOC to an HVECU 30, and, when charge memory effects are detected, notifies the HVECU 30 of this fact. Based on the SOC input from the battery ECU 14, the HVECU 30 controls operation of a load 32. Here, the load 32 may comprise a driving motor, a generator, an inverter, and so forth, and is controlled to thereby control consumption of power from the battery 10. That is, power from the battery 10 is supplied via the inverter 34 to a driving motor 36.

The HVECU 30 determines an output torque of the driving motor 36 based on an amount by which an accelerator is pressed, and controls the inverter 34 so as to realize the determined output torque to thereby control the driving motor 36. Also, the HVECU 30 sends a power-related request to the engine ECU 40 to control a driving force of an engine-driven generator 42. With this arrangement, an amount of charging to the battery 10 can be controlled.

Figure 3:
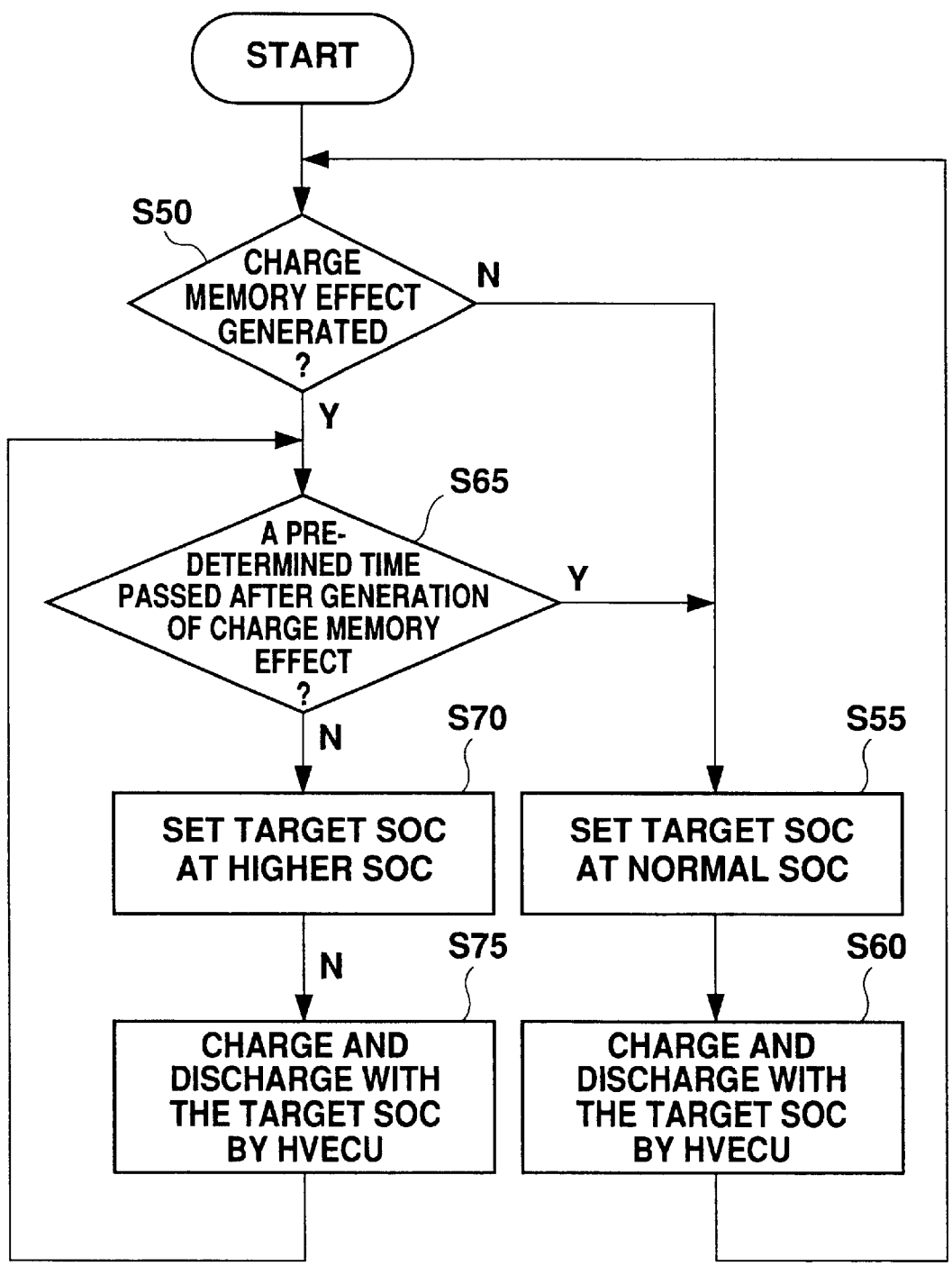
FIG. 3 is a flowchart explaining cancellation of charge memory effects.

In the following, cancellation of charge memory effects by this system will be described. FIG. 3 is a flowchart explaining cancellation of charge memory effects.

In this system, for protection of the battery 10, the SOC is basically controlled so as to remain within an appropriate SOC range (an appropriately charged range), which is defined by control upper and lower limits. Specifically, a target SOC (a target charged amount level) is set within the appropriate SOC range so that SOC varies within a predetermined control range which is set with the target SOC as the center.

The control upper and lower limits are determined as, for example, SOC of 80% and 20%, respectively. Based on the I–V characteristics obtained based on outputs from the voltage sensor 12 and the current sensor 16, the battery ECU 14 makes lower limit determination when determining that the SOC of the battery 10 has varied to reach the lower limit, and upper limit determination when determining that the SOC has reached a control upper limit. For example, when lower limit determination is made, the HVECU 30 prohibits discharging from the battery 10. That is, the HVECU 30 controls the load 32 to prohibit the driving motor 36 from consuming a larger amount of power than is being generated by the generator 42. When upper limit determination is made, on the other hand, the HVECU 30 prohibits charging of the battery 10.

Here, the battery ECU 14 of this system observes whether or not charge memory effects are generated, based on outputs from various sensors provided to the battery 10. When generation of charge memory effects is not determined (S50), the HVECU 30 applies normal charged amount control by, specifically, setting the target SOC of the battery 10 at a normal value, or 50% (S55). That is, for SOC larger than 50%, the HVECU 30 controls such that a less amount of power is generated using engine power to accelerate discharging from the battery 10. For SOC smaller than 50%, on the other hand, the HVECU 30 controls such that a larger amount of power is generated using engine power to accelerate charging of the battery 10 (S60).

Figure 4A:
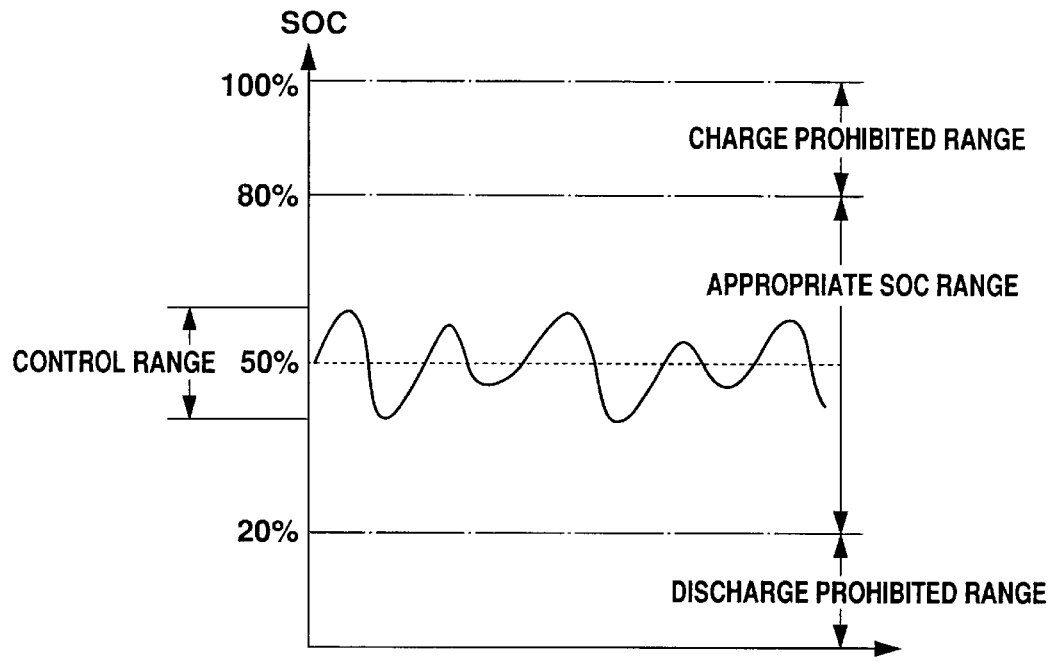
FIGS. 4A and 4B are diagrams showing examples of SOC variation as time passes under charged amount control of the system according to the present invention.
Figure 4B:
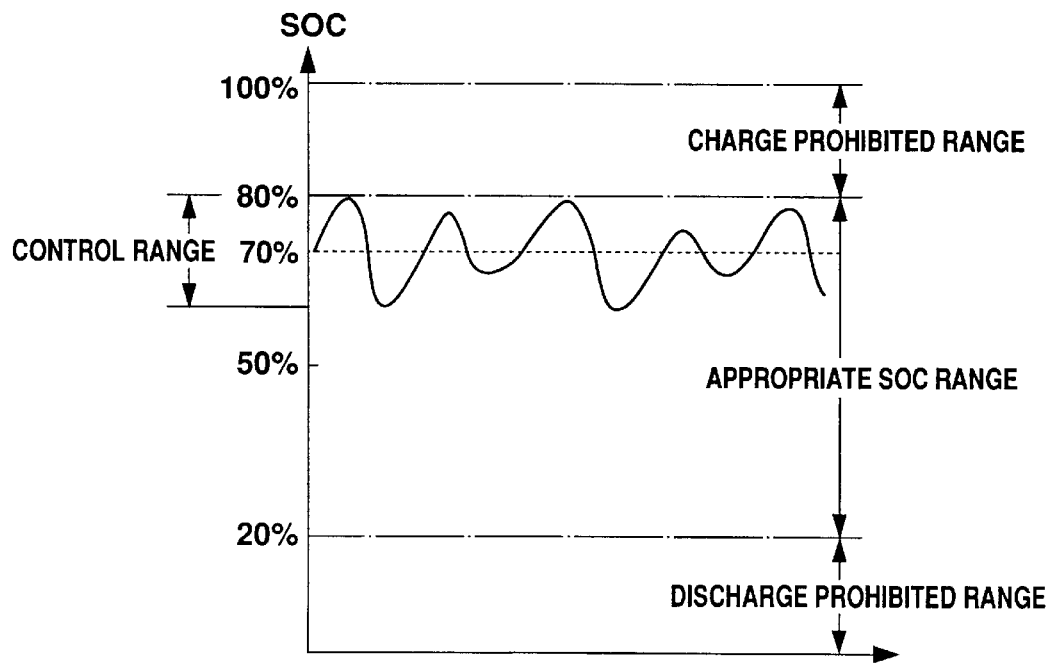

FIGS. 4A and 4B are graphs showing examples of SOC variation as time passes under charged amount control by the system of the present invention. FIG. 4A relates to control at ordinary time, as described above, while FIG. 4B relates to control with charge memory effects present, as described below. As shown in FIG. 4A, at ordinary time, the HVECU 30 controls such that SOC varies within a predetermined control range with SOC of 50% at the center (for example ±10%).

When the battery ECU 14 determines generation of charge memory effects (S50), on the other hand, that fact is notified to the HVECU 30. Upon receipt of the notice notifying generation of charge memory effects, the HVECU 30 activates a timer to measure the lapse of a predetermined time. Then, determination is made as to whether or not a predetermined time has elapsed and, upon determination that it is not yet elapsed (S65), the HVECU 30 sets a target SOC of the battery 10 at a value in the vicinity of the control upper limit, that is, a closer-to-limit level, and applies control for the presence of memory effects using that target SOC (S70). Specifically, the target SOC is set such that the upper limit of a control range which is determined with the target SOC at the center does not exceed the control upper limit of the appropriate SOC range. Here, the control range is set as ±10%, similar to normal control, and the target SOC is set as 70% in view of the fact that the control upper limit is 80%. When SOC is larger than 70%, the HVECU 30 controls such that a less amount of power is generated using engine power to accelerate discharging from the battery 10. When SOC is smaller than 70%, on the other hand, the HVECU 30 controls such that a larger amount of power is generated using engine power to accelerate charging to the battery 10 (S75). FIG. 4B shows SOC variation under this control.

Such control, in which battery charging and discharging are repeated with a target SOC set in the vicinity of the control upper limit, is continued until expiration of the predetermined time set as above. Upon determination of the expiration of the predetermined time at S65, the target SOC is set back at a normal value, or 50%, and normal charging and discharging control is resumed (S55, S60).

Here, the predetermined time to measure is determined based on a time required to cancel charge memory effects. A time required to cancel charge memory effects can vary depending on a difference between a control upper limit and a target SOC which is set under control for the presence of memory effects or on a size of an SOC control range which is set with the target SOC at the center.

It should be noted that, although a structure for canceling charge memory effects is described in the above, the system may be constructed for cancellation of discharge memory effects. In that case, the battery ECU 14 determines generation of discharge memory effects and, upon generation of discharge memory effects, the HVECU 30 sets a target SOC in the vicinity of a control lower limit, that is, a closer-to-limit level, (for example, SOC of 30%) before beginning charging and discharging control with a control range of ±10%. This control is continued for a predetermined time.

According to the battery control system of the present invention, because memory effects can be cancelled without applying excessive charging or discharging of a battery, deterioration of a battery and vehicle performance, as caused during conventional canceling of memory effects, can be prevented. Further, for cancellation of charge memory effects, a target charged amount level is set at a predetermined higher level and a charged amount control range is set to be centered on that target charged amount level and to be narrower than an appropriately charged range. With these arrangements, a charged amount is more likely to vary within a higher charged amount range, which can effectively cancel memory effects, and charge memory effects can therefore be smoothly cancelled. Similar advantage can be obtained in cancellation of discharge memory effects.

The present invention has been described with reference to an embodiment in the above, but the technical range of the present is not limited to the above embodiment. It is obvious that various modifications and improvements can be added to the above embodiment, and that embodiments as thus modified or improved are also included in the technical scope of the present invention.

What is claimed is:

1. A battery control system for controlling a charged amount of a secondary battery mounted on a hybrid vehicle such that the charged amount is maintained in the vicinity of a predetermined target charged amount level which is set within an appropriately charged range in which excessive charging and discharging are prevented, comprising:

memory effects determining means for determining generation of memory effects in the secondary battery; and target level setting means for setting the target charged amount level at a predetermined normal level when generation of memory effects is not determined, and at a closer-to-limit level which is closer than the normal level to an upper limit or a lower limit of the appropriately charged range when generation of memory effects is determined.

2. The battery control system according to claim 1, wherein the charged amount is controlled so as to vary within a predetermined control range which has the target charged amount level at the center and is set within the appropriate charged range, and a control range for the closer-to-limit level is identical in size to or narrower than a control range for the normal level.

3. The battery control system according to claim 1, wherein the target level setting means maintains the target charged amount level at the closer-to-limit level for a predetermined amount of time when generation of memory effects is determined.

4. The battery control system according to claim 1, wherein the closer-to-limit level is set in the vicinity of the upper limit of the appropriately charged range.

5. A battery control system for controlling a charged amount of a secondary battery mounted on a hybrid vehicle such that the charged amount is maintained in the vicinity of a predetermined target charged amount level which is set within an appropriately charged range in which excessive charging and discharging are prevented, comprising:

memory effects determining means for determining generation of charge memory effects and discharge memory effects of the secondary battery;

target level setting means for setting the target charged amount level at a predetermined normal level when generation of charge memory effects or discharge memory effects is not determined, in the vicinity of an upper limit of the appropriately charged range when generation of charge memory effects is determined, and in the vicinity of a lower limit of the appropriately charged range when generation of discharge memory effects is determined.

* * * * *